US009834854B2

(12) United States Patent
Ozoemena et al.

(10) Patent No.: US 9,834,854 B2
(45) Date of Patent: Dec. 5, 2017

(54) PRODUCTION OF A SPINEL MATERIAL

(71) Applicant: CSIR, Pretoria (ZA)

(72) Inventors: Kenneth Ikechukwu Ozoemena, Pretoria (ZA); Charl Jeremy Jafta, Pretoria (ZA)

(73) Assignee: CSIR, Pretoria (ZA)

(*) Notice: Subject to any disclaimer, the term of this patent is extended or adjusted under 35 U.S.C. 154(b) by 114 days.

(21) Appl. No.: 14/420,209

(22) PCT Filed: Jul. 25, 2013

(86) PCT No.: PCT/IB2013/056103
§ 371 (c)(1),
(2) Date: Feb. 6, 2015

(87) PCT Pub. No.: WO2014/024075
PCT Pub. Date: Feb. 13, 2014

(65) Prior Publication Data
US 2015/0197872 A1    Jul. 16, 2015

(30) Foreign Application Priority Data

Aug. 10, 2012  (ZA) .................................. 2012/06016

(51) Int. Cl.
| C30B 1/04 | (2006.01) |
| C01G 53/00 | (2006.01) |
| H01M 4/505 | (2010.01) |
| C30B 29/22 | (2006.01) |
| C30B 30/02 | (2006.01) |
| H01M 4/525 | (2010.01) |
| H01M 4/02 | (2006.01) |

(52) U.S. Cl.
CPC .............. *C30B 1/04* (2013.01); *C01G 53/54* (2013.01); *C30B 29/22* (2013.01); *C30B 30/02* (2013.01);
(Continued)

(58) Field of Classification Search
CPC combination set(s) only.
See application file for complete search history.

(56) References Cited

U.S. PATENT DOCUMENTS

| 4,980,251 A * | 12/1990 | Thackeray | C01G 45/1242 423/599 |
| 6,348,182 B1 * | 2/2002 | Lu | C01G 45/1242 423/599 |
| 2009/0029253 A1 * | 1/2009 | Itou | H01M 4/525 429/223 |

OTHER PUBLICATIONS

Duncan et al., "Microwave-assisted sol-gel synthesis of high-voltage LiMn 1.5 Ni 0.5 0 4 cathode material for Li-ion batteries," 215th ESC Meeting Absracts, Jan. 1, 2009, 1 page.
(Continued)

*Primary Examiner* — Duy Deo
*Assistant Examiner* — Erin Bergner
(74) *Attorney, Agent, or Firm* — McDonnell Boehnen Hulbert & Berghoff LLP

(57) ABSTRACT

A process for producing a lithium-manganese-nickel oxide spinel material includes maintaining a solution comprising a dissolved lithium compound, a dissolved manganese compound, a dissolved nickel compound, a hydroxycarboxylic acid, a polyhydroxy alcohol, and, optionally, an additional metallic compound, at an elevated temperature $T_1$, where $T_1$ is below the boiling point of the solution, until the solution gels. The gel is maintained at an elevated temperature until it ignites and burns to form a Li—Mn—Ni—O powder. The Li—Mn—Ni—O powder is calcined to burn off carbon and/or other impurities present in the powder. The resultant calcined powder is optionally subjected 1 to microwave treatment, to obtain a treated powder, which is annealed to crystallize the powder. The resultant annealed material is optionally subjected to microwave treatment. At least one of the microwave treatments is carried out. The lithium-manganese-nickel oxide spinel material is thereby obtained.

20 Claims, 6 Drawing Sheets

(52) U.S. Cl.
CPC ........... *H01M 4/505* (2013.01); *H01M 4/525* (2013.01); *C01P 2002/32* (2013.01); *C01P 2002/54* (2013.01); *C01P 2002/72* (2013.01); *C01P 2002/74* (2013.01); *C01P 2002/77* (2013.01); *C01P 2002/85* (2013.01); *C01P 2004/03* (2013.01); *H01M 2004/028* (2013.01)

(56) References Cited

OTHER PUBLICATIONS

Ozoemena et al., "Physico-electrochemical properties of sub-micron sized and disordered LiNi 0.5 Mn 1.5 0 4 obtained by microwave-assisted modified Pechini method," Phys. Chem. C. J. Electrochem. Soc. J. Power Sources J. Electrochem. So. A. Energy Environ. Sci. J. Power sources J. Mater. Chem., Jan. 1, 2011, 1 page.

Santhanam et al., "Research progress in high voltage spinel LiNi0.5Mn1.5O4 material," Journal of Power Sources, Elsevier SA, CH, vol. 195, No. 17, Sep. 1, 2010, pp. 5442-5451.

Kunduraci et al., "Synthesis and Characterization of Nanostructured 4.7?V Li[sub x]Mn[sub 1.5]Ni[sub 0.5]0[sub 4] Spinels for High-Power Lithium-Ion Batteries," Journal of the Electrochemical Society, vol. 153, No. 7, Jan. 1, 2006, p. A1345-A1352.

Jafta et al., "Microwave-Assisted Synthesis of High-Voltage Nanostructured LiMn 1.5 Ni 0.5 0 4 Spinel: Tuning the Mn 3+ Content and Electrochemical Performance," ACS Applied Materials & Interfaces, vol. 5, No. 15, Jul. 15, 2013, pp. 7592-7598.

Jie Xiao et al., "High-Performance LiNi0.5Mn1.5O4 Spinel Controlled by Mn3+ Concentration and Site Disorder" Adv. Mater. vol. 24, pp. 2109-2116, 2012.

* cited by examiner

PRODUCTION OF A SPINEL MATERIAL

This application is a U.S. national phase application of International Patent Application No. PCT/IB2013/056103 filed on Jul 25, 2013, which claims the benefit of South African patent application 2012/06016, filed Aug. 10, 2012.

THIS INVENTION relates to the production of a spinel material. More particularly, it relates to a process for producing a lithium-manganese-nickel oxide spinel material suitable for use as a cathode material in a lithium-ion electrochemical cell or battery.

Lithium-ion batteries are viewed as the next generation of energy-storage devices for a variety of everyday applications such as hybrid electric vehicles, laptop computers, cell phones, etc. A particular lithium-manganese-nickel oxide material, $LiMn_{1.5}Ni_{0.5}O_4$, has been receiving major research attention as a spinel cathode material for lithium-ion electrochemical cells or batteries because of its high operating voltage (~4.8 V) and its high intrinsic rate capability. Despite its many advantages, $LiMn_{1.5}Ni_{0.5}O_4$, still encounters many obstacles for high-rate applications. For example, it is very difficult to synthesize a pure, stoichiometric $Li_{1-x}[Ni_{0.5}Mn_{1.5}]O_4$ spinel as $Li_yNi_{1-y}O$ (an impurity) appears as a second phase, negatively impacting on the electrochemical behaviour.

It is hence an object of this invention to provide an improved process for producing or synthesizing $LiMn_{1.5}Ni_{0.5}O_4$ and enhancing its electrochemical performance.

A process for producing a lithium-manganese-nickel oxide spinel material, which process comprises
- maintaining a solution comprising a dissolved lithium compound, a dissolved manganese compound, a dissolved nickel compound, a hydroxycarboxylic acid, a polyhydroxy alcohol, and, optionally, an additional metallic compound, at an elevated temperature $T_1$, where $T_1$ is below the boiling point of the solution, until the solution gels;
- maintaining the gel at an elevated temperature until it ignites and burns to form a Li—Mn—Ni—O powder;
- calcining the Li—Mn—Ni—O powder to burn off carbon and/or other impurities present in the powder, thereby obtaining a calcined powder;
- optionally, subjecting the calcined powder to microwave treatment, to obtain a treated powder;
- annealing the calcined powder or the treated powder to crystallize the powder, thereby obtaining an annealed material; and
- optionally, subjecting the annealed material to microwave treatment, with the proviso that at least one of the microwave treatments is effected, thereby to obtain the lithium-manganese-nickel oxide spinel material.

Thus, when the calcined material is microwave treated, and the annealed material is not microwave treated, the annealed material will be the lithium-manganese-nickel oxide spinel material that is the product of the process. However, when the calcined powder is not subjected to microwave treatment, then the annealed material will be subjected to microwave treatment, with the thus microwaved material then being the lithium-manganese-nickel oxide spinel material that is the product of the process. Naturally, if desired, both the microwave treatment of the calcined material and the microwave treatment of the annealed material, can be employed.

In one embodiment of the invention, the lithium-manganese-nickel oxide spinel material may be undoped. The lithium-manganese-nickel oxide spinel material may then, in particular, be $LiMn_{1.5}Ni_{0.5}O_4$, which, as indicated hereinbefore, is particularly suited for use as a cathode material in a lithium-ion electrochemical cell or battery.

However, in another embodiment of the invention, the lithium-manganese-nickel oxide spinel material may be doped. While the effect of such doping could be to control the amount of $Mn^{3+}$ in the final lattice structure or the degree of disorder, as discussed hereunder, the primary aim thereof would be to improve other properties of the spinel material such as cycle stability.

The lithium-manganese-nickel oxide spinel material may be ordered, i.e. not be oxygen deficient. However, instead, the spinel material produced by the process of the invention could be disordered or oxygen-deficient.

For example, the lithium-manganese-nickel oxide spinel material may be $LiMn_{1.5}Ni_{0.5}O_{4-\delta}X_\delta$ where $\delta<1$ and X is an anion such as fluoride. This compound is both doped and disordered.

The process may include forming the solution of the lithium compound, the manganese compound, the nickel compound, the hydroxycarboxylic acid, and the polyhydroxy alcohol. The formulation of the solution may then include admixing a solution of the lithium compound dissolved in a solvent, a solution of the manganese compound dissolved in a solvent, a solution of the nickel compound dissolved in a solid, the hydroxycarboxylic acid and the polyhydroxy alcohol.

While the lithium compound, the manganese compound, and the nickel compound can initially each be in the form of a separate solution in which each is dissolved, they are preferably all dissolved in the same solvent so that a single solution containing the dissolved lithium, manganese and nickel compounds is then admixed with the hydroxycarboxylic acid and the polyhydroxy alcohol. The lithium, manganese and nickel compounds are preferably water soluble so that water, preferably deionized water, can be used as the solvent of the solution. Thus, in particular, nitrates of lithium, manganese and nickel may be used, i.e. $LiNO_3$, $Mn(NO_3)_2$ (more particularly $Mn(NO_3)_2 \cdot 4H_2O$) and $Ni(NO_3)_2$ (more particularly $Ni(NO_3)_2 \cdot 6H_2O$) may be used. The solution may thus contain the necessary stoichiometric amounts of $LiNO_3$, $Mn(NO_3)_2 \cdot 4H_2O$ and $Ni(NO_3)_2 \cdot 6H_2O$ to obtain $LiMn_{1.5}Ni_{0.5}O_4$ as the end product.

The additional metallic compound, when present, will be selected to improve stability of the resultant spinel material. Thus, for example, the additional metallic compound may be a compound of aluminium or zirconium. Such additional metallic compound will thus also be water soluble, and may be a nitrate of the metal in question.

The metallic compounds, i.e. the lithium, manganese, nickel, and additional metal compounds, may instead be any other metallic salts (derived from both weak and strong acids such as the sulphates, carbonates, halides, and the acetates) other than the nitrates.

The hydroxycarboxylic acid acts as a reduction agent, and may be citric acid.

The polyhydroxy alcohol may be ethylene glycol or polyethylene glycol.

The citric acid and the ethylene glycol may be present in the solution in an appropriate molar ratio of citric acid to ethylene glycol, e.g. about 1:4. The citric acid may initially be in the form of a solution thereof in water, particularly deionized water.

The process may comprise initially heating the mixture of the citric acid solution and the ethylene glycol to the temperature $T_1$ with stirring; thereafter, the solution of the lithium, manganese and nickel nitrates may be added slowly, e.g. dropwise, to the citric acid/ethylene glycol solution.

As set out hereinbefore, $T_1$ is below the boiling point of the solution comprising the solvent for the lithium, manganese and nickel compounds; the dissolved lithium, manganese and nickel compounds; the hydroxycarboxylic acid and the polyhydroxy alcohol. It is important that $T_1$ be below the boiling point of the solution, to prevent premature evaporation of the solvent and other components of the solution, i.e. to prevent such evaporation before the gel-forming reaction (polymer gel formation) is complete. When the solvent is water as hereinbefore set out, then 90° C.≤$T_1$<100° C. Preferably, $T_1$ may then be about 90° C.

The elevated temperature at which the gel is maintained may be $T_2$, where 90° C.≤$T_2$<100° C. Preferably, $T_2$ is the same as $T_1$. In other words, preferably the solution is maintained at $T_1$ until there has been complete or adequate gel formation, and the gel is then maintained at $T_1$ until it ignites and burns to form the Li—Mn—Ni—O powder. The time $t_1$ that the solution must be maintained at $T_1$ for complete gel formation and evaporation of liquid components of the solution, and that the gel must be maintained at until it ignites, is dependent on factors such as the volume of the solution, $T_1$, etc, but is typically at least 30 minutes.

To form the Li—Mn—Ni—O powder, a modified, one-step, powder-forming Pechini method is thus used.

The calcination of the Li—MN—Ni—O powder may be effected at a temperature $T_3$. $T_3$ will thus be sufficiently high for carbon and/or other impurities present in the powder to burn off. The calcination will thus be effected in a non-reducing atmosphere, preferably in an oxidizing atmosphere. Thus, $T_3$ may be as low as 300° C. to 350° C. However, more preferred is 400° C.≤$T_3$<600° C.; typically, $T_3$ is about 500° C. The calcination may be continued for a period of time $t_2$, with $t_2$ thus being long enough to achieve burning off of carbon and/or other impurities to a desired degree, and with $t_2$ also being dependent on factors such as the quantity of powder, $T_3$, etc. Thus, preferably, $t_2$<12 hours; typically, $t_2$ may be about 6 hours.

The annealing of the calcined or the treated powder may be effected at a temperature $T_4$. $T_4$ will thus be sufficiently high to crystallize the powder. Thus, preferably, 700° C.≤$T_4$≤900° C. Typically, $T_4$ may be about 700° C. or about 800° C. The annealing may be effected for a period of time $t_3$, with $t_3$ thus being long enough to achieve a desired degree of annealing, i.e. to achieve a desired degree of crystallinity of the powder. Typically, $t_3$ will be less than 12 hours, e.g. about 8 hours.

The microwave treatment may comprise subjecting the calcined powder to microwaves (typically at λ=0.12236 m, 600 W) at about 60° C. for between 10 and 20 minutes, typically about 15 minutes. The microwave power may be less than or greater than 600 W.

As also discussed in more detail hereinafter, the inventors surprisingly found that by producing $LiMn_{1.5}Ni_{0.5}O_4$ using a modified, one step, powder forming Pechini method, coupled with a microwave irradiation of the powder, the $Mn^{3+}$ content and site disorder can be controlled, thereby enhancing/maintaining electrochemical performance, e.g. capacity, cyclability, elimination of impurities, etc. It is thus not necessary to partially substitute Ni and/or Mn with metallic elements such as Ti, Fe, Cr, Ru or Mg to achieve this purpose. The process of the invention is thus characterized thereby that it does not include adding to any of the solutions and/or to the powder a metallic element such as Ti, Fe, Cr, Ru or Mg for purposes of partially replacing some of the Ni and/or Mn in $Li Mn_{1.5}Ni_{0.5}O_4$. Thus, the end product does not contain any Ti, Fe, Cr, Ru or Mg.

The invention will now be described in more detail with reference to the following non-limiting example and accompanying drawings. In the drawings FIG. 1 show typical FESEM images of the mesoporous LMN-700, LMN-800, LMN-700-microwave and LMN-800-microwave samples of the Example;

FIG. 2 compares the X-Ray Diffraction (XRD) patterns of the LMN-700, LMN-800, LMN-700-microwave and LMN-800-microwave samples of the Example;

FIG. 3 show $Mn2p_{3/2}$ X-Ray Photoelectron Spectroscopy (XPS) peaks of LMN-700, LMN-800, LMN-700-microwave and LMN-800-microwave samples of the Example;

FIG. 4 compares the discharge evolutions or discharge curves of LMN-700, LMN-800, LMN-700-microwave and LMN-800-microwave samples of the Example; and FIG. 5 show the cycling comparisons at 0.1° C. rate of $LiMn_{1.5}Ni_{0.5}O_4$ spinel (annealed at 700° C. and 800° C.) and the $LiMn_{1.5}Ni_{0.5}O_4$ spinel radiated with microwaves samples (annealed at 700° C. and 800° C.) of the Example.

Figure 1:
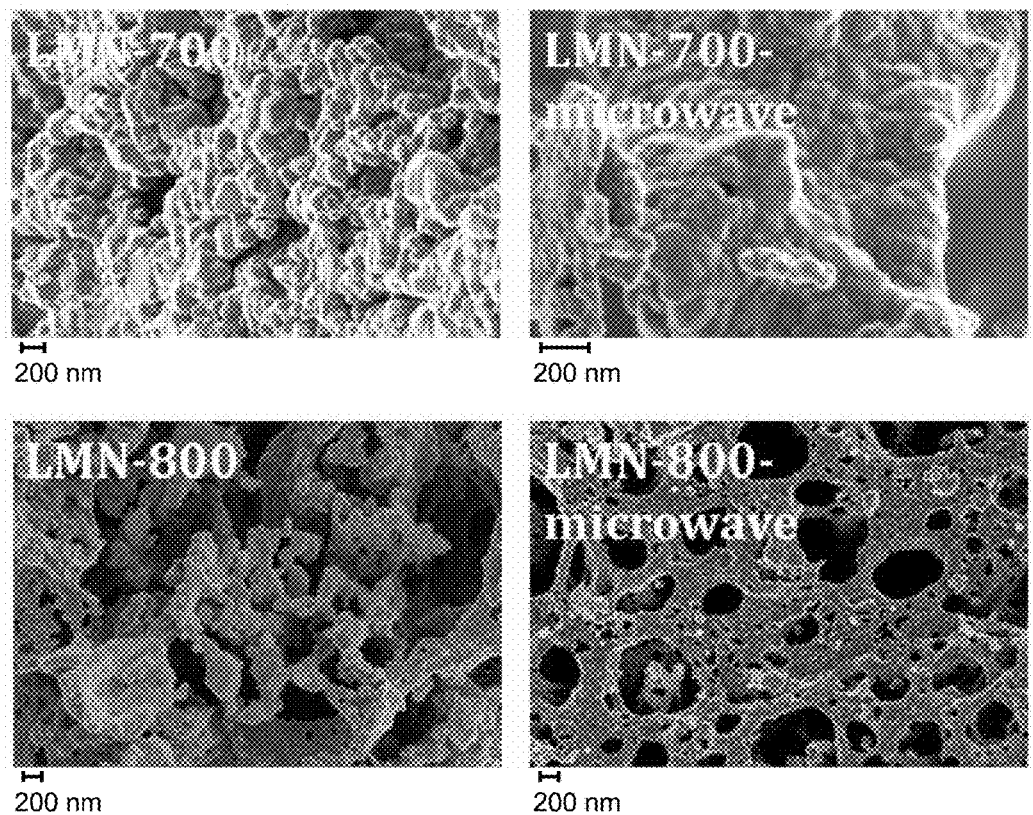

EXAMPLE $LiMn_{1.5}Ni_{0.5}O_4$ (LMN) was prepared by a one-step powder-forming, Pechini modified method involving the use of citric acid (CA), ethylene glycol (EG) and nitrate salts. The reducing agent, CA (dissolved in deionised water) and EG was mixed in the ratio 1:4 (CA:EG) and heated at 90° C. while constantly stirred for 30 min. Stoichiometric amounts of $LiNO_3$, $Ni(NO_3)_2.6H_2O$ and $Mn(NO_3)_2.4H_2O$ were dissolved in deionised water and introduced drop-wise to the CA/EG solution. After heating the resultant solution to, and maintaining it at, 90° C. with constant stirring, the viscosity of the solution increased constantly due to evaporation of the water; the viscous solution subsequently dehydrated into a gel. The gel was kept at a temperature of 90° C. until the gel spontaneously burnt (typically about 30 minutes after the salt-containing solution was added to the reducing agent) to form the desired powder. The powder was pre-heated, i.e. calcined, at 500° C. for 6 h to get rid of carbonaneous materials present on the powder from the burning, and then annealed at 700° C. or 800° C. for 8 h (herein referred to as LMN-700 or LMN-800, respectively). To study the impact of microwave irradiation, two batches of the pre-heated powder at 500° C. were subjected to microwave irradiation (using the Anton Paar Multiwave 3000 system, λ=0.12236 m) at 600 W for 15 min, where the temperature of the samples reached a maximum of 60° C. (measured with an infrared thermometer, which was approximately 5 cm away from the bottom of the vessel containing the powders), and then annealed at 700° C. or 800° C. for 8 h (herein referred to as LMN-700-mic or LMN-800-mic, respectively).

The structural characterization was done by XRD using a Bruker AXS D8 ADVANCE X-ray Diffractometer with Ni-filtered Cu $K_\alpha$ radiation (λ=1.5406 Å) for the LMN-700/LMN-700-mic and a PANalytical X'pert Pro Powder Diffractometer with Fe-filtered Co $K_\alpha$ radiation (λ=1.7890 Å) for the LMN-800/LMN-800-mic. The scanning speed was 0.02° per step with a dwell time of 5 s for all samples. The LMN-700/LMN-700-mic and LMN-800/LMN-800-mic powders were mounted in a PHI 5400 ESCA and PHI 5000 Versaprobe -Scanning ESCA Microprobe vacuum chambers with base pressures 1×10$^{-8}$ Torr. XPS was performed for LMN-700/LMN-700-mic and LMN-800/LMN-800-mic using a non-monochromatic aluminium (Al) K$_\alpha$ source (1486.6 eV) and an Al monochromatic K$_\alpha$ source (1486.6 eV), respectively. The XPS data analysis was performed with the XPS Peak 4.1 program and a Shirley function was used to subtract the background.

Electrochemical measurements were performed in a two-electrode coin cell (LIR-2032) assembled with the LMN materials as the positive electrode and lithium metal foil as the negative electrode using a MACCOR series 4000 tester. The cathodes were prepared by coating the slurry of a mixture composed of 80% active material, 10% acetylene black, and 10% polyvinylidene fluoride onto cleaned and polished aluminium foil. Subsequently, the materials were dried at 90° C. under vacuum (~10$^{-1}$ Torr) for 24 h. The cells were assembled in an argon-filled MBraun glovebox (O$_2$, H$_2$O<0.5 ppm). The electrolyte was 1M LiPF$_6$ in a mixture of 1:1 (v/v) EC:DMC. A polypropylene film (Celgard 2300, Celgard LLC, Charlotte, N.C., USA) was used as the separator.

SEM Analysis (Morphological Analysis)

Mesoporous structures were expected as already observed in the literature for LMN. As can be seen from FIG. 1, all materials are nanostructured (~100 nm size); however, the microwaved samples have a more interlinked structure. Clearly, the microwave irradiation has some impacts on the morphology and structure.

XRD Analysis (Structural Analysis)

Figure 2:
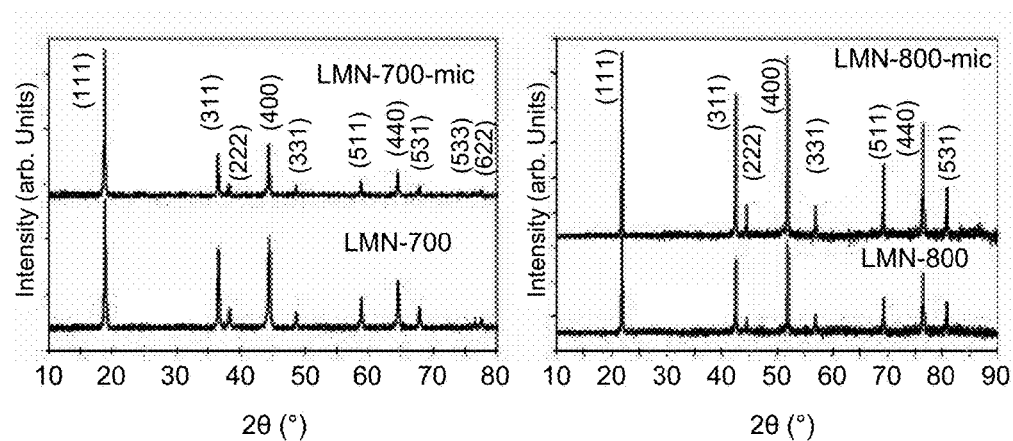

FIG. 2 compares the XRD patterns of the LMN and LMN-microwave samples. The diffraction peaks are ascribed to a cubic structure with a space group of Fd3m, indicating the formation of a single-phase LiMn$_{1.5}$Ni$_{0.5}$O$_4$. All fundamental peaks are sharp, which indicates that the prepared powders are well crystallized. The ratio of the I$_{(311)}$ and I$_{(400)}$ peaks (0.86-0.88) is an indication of the structural stability of the [Mn$_2$]O$_4$ spinel framework. The high intensity ratio of the sample treated with microwave shows a better structural stability. An increase in the cubic lattice parameter is related to the large-sized Mn$^{3+}$ ion, indicating the reduction of the Mn$^{4+}$ to Mn$^{3+}$ by microwave treatment. Note that such reduction of the inactive Me to the redox-active Mn$^{3+}$ is (should be) accompanied by the loss of oxygen (disorderliness, signified by high value of the ratio I$_{(311)}$ and I$_{(400)}$) to maintain charge neutrality. Thus, microwave treatment clearly provides a facile approach to tune the Mn$^{3+}$ concentration (and site orderliness), which allow for the evaluation of its influences on the electrochemical performances of the high-voltage LiMn$_{1.5}$Ni$_{0.5}$O$_4$. Interestingly, as proved using XPS (see below), the LMN-microwave contains more Mn$^{3+}$ ion than the parent LMN. Thus, the slight increase in the cubic lattice parameter for the LMN-microwave is due to the larger size of the Mn$^{3+}$ ion.

The powder XRD patterns (FIG. 2) are characteristic of the cubic spinel structures with the microwave-treated samples showing sharper diffraction peaks than the bare samples, meaning that microwave irradiation enhanced crystallinity in the spinel. The impurity phase is virtually non-existent in the materials. The lattice parameters (a-value/Å and unit cell volume/Å$^3$) were calculated as 8.153 Å and 541.907 Å$^3$ for the LMN-700; 8.160 Å and 543.170 Å$^3$ for the LMN-700-mic; 8.180 Å and 547.417 Å$^3$ for the LMN-800; 8.179 Å and 547.109 Å$^3$ for the LMN-800-mic. These values are comparable to values in literature. From the XRD patterns of the LMN-700 and LMN-700-mic, the latter shows preferential crystal growth according the (111) reflection, which may be ascribed to the microwave irradiation that changes the crystal growth kinetics. The slight increase in the lattice parameters for the pristine 800 sample compared to its 700 counterpart further proves that the 800 sample is Mn$^{3+}$-enriched (disordered phase). The increase in the lattice parameter for the LMN-700-mic indicates the creation of some oxygen vacancies in the spinel structure following the microwave irradiation process which causes some Me ions to be converted to Mn$^{3+}$ due to charge compensation. On the other hand, the lattice parameters for the LMN-800 and LMN-800-mic suggests a slight decrease in the oxygen vacancies for the microwave-irradiated disordered material. This suggests that at the experimental conditions employed, microwave irradiation simply adjusts the Mn$^{3+}$ content to a lower value. As set out hereinafter, these adjustments of the Mn$^{3+}$/Mn$^{4+}$ ratios (or oxygen vacancy concentration) have profound effects on the electrochemical properties of the spinel as a cathode material for lithium ion battery.

XPS Analysis (Oxidation States Analysis)

Figure 3:
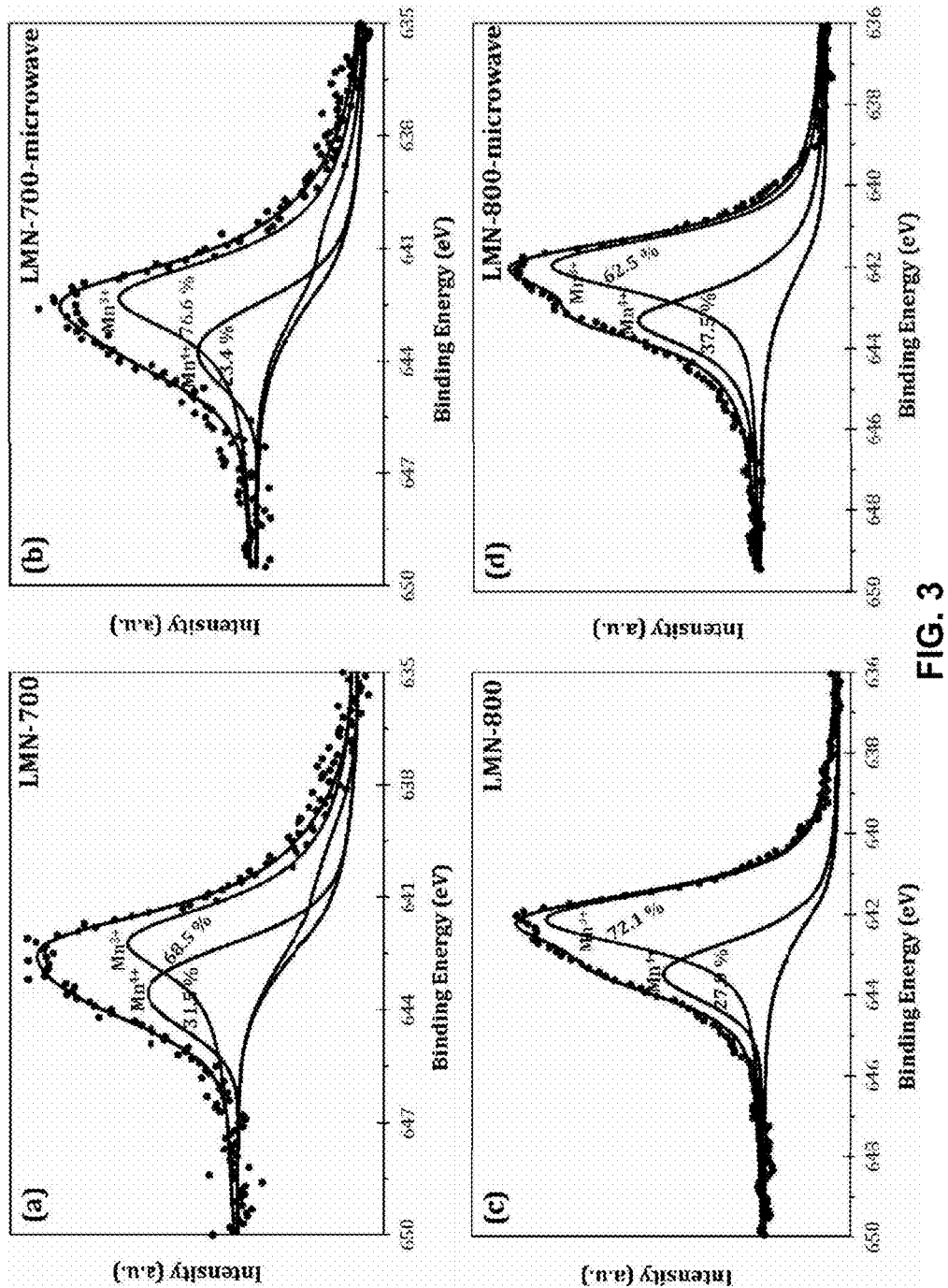

To determine the actual amounts of the Mn$^{3+}$ and Mn$^{4+}$ in the spinel, XPS experiments were performed for the powdered spinel samples. FIG. 3 shows the deconvoluted, detailed XPS of the Mn 2p$_{3/2}$ peaks of the LMN-700/LMN-700-mic and LMN-800/LMN-800-mic samples. Two peaks (as marked) are attributed to Mn$^{3+}$ and Me and another (in the LMN-700/LMN-700-mic spectra) to a Ni Auger peak. The binding energy peak positions corresponding to Me and Mn$^{3+}$ are comparable with other binding energy values reported in literature. As shown in Table 1, the ratio of Mn$^{3+}$ to Me (i.e., Mn$^{3+}$/Mn$^{4+}$) is 2.2 and 3.3 for the LMN-700 and LMN-700-mic, respectively. This increase in the Mn$^{3+}$ content in good agreement with the XRD data of increased a-lattice parameter, further confirming that microwave irradiation causes oxygen deficiency causing the Me to be converted to Mn$^{3+}$ in the ordered spinel. For the LMN-800 and LMN-800-mic, the Mn$^{3+}$/Mn$^{4+}$ is 2.6 and 1.7, respectively. Again, this is in good agreement with the XRD data that predicted a slight downward adjustment of the Mn$^{3+}$ content of the disordered sample.

TABLE 1

Mn 2p$_{3/2}$ peak positions and cation distribution

| Sample | Binding energy position (eV) | | Cation distribution | | |
|---|---|---|---|---|---|
| | Mn$^{4+}$ | Mn$^{3+}$ | Mn$^{4+}$ | Mn$^{3+}$ | Mn$^{3+}$/Mn$^{4+}$ |
| LMN-700 | 643.2 | 642.1 | 31.5% | 68.5% | 2.17 |
| LMN-700-mic | 643.4 | 642.2 | 23.4% | 76.6% | 3.27 |
| LMN-800 | 643.4 | 642.1 | 27.9% | 72.1% | 2.58 |
| LMN-800-mic | 643.3 | 641.9 | 37.5% | 62.5% | 1.67 |

Discharge Capacities

Figure 4:
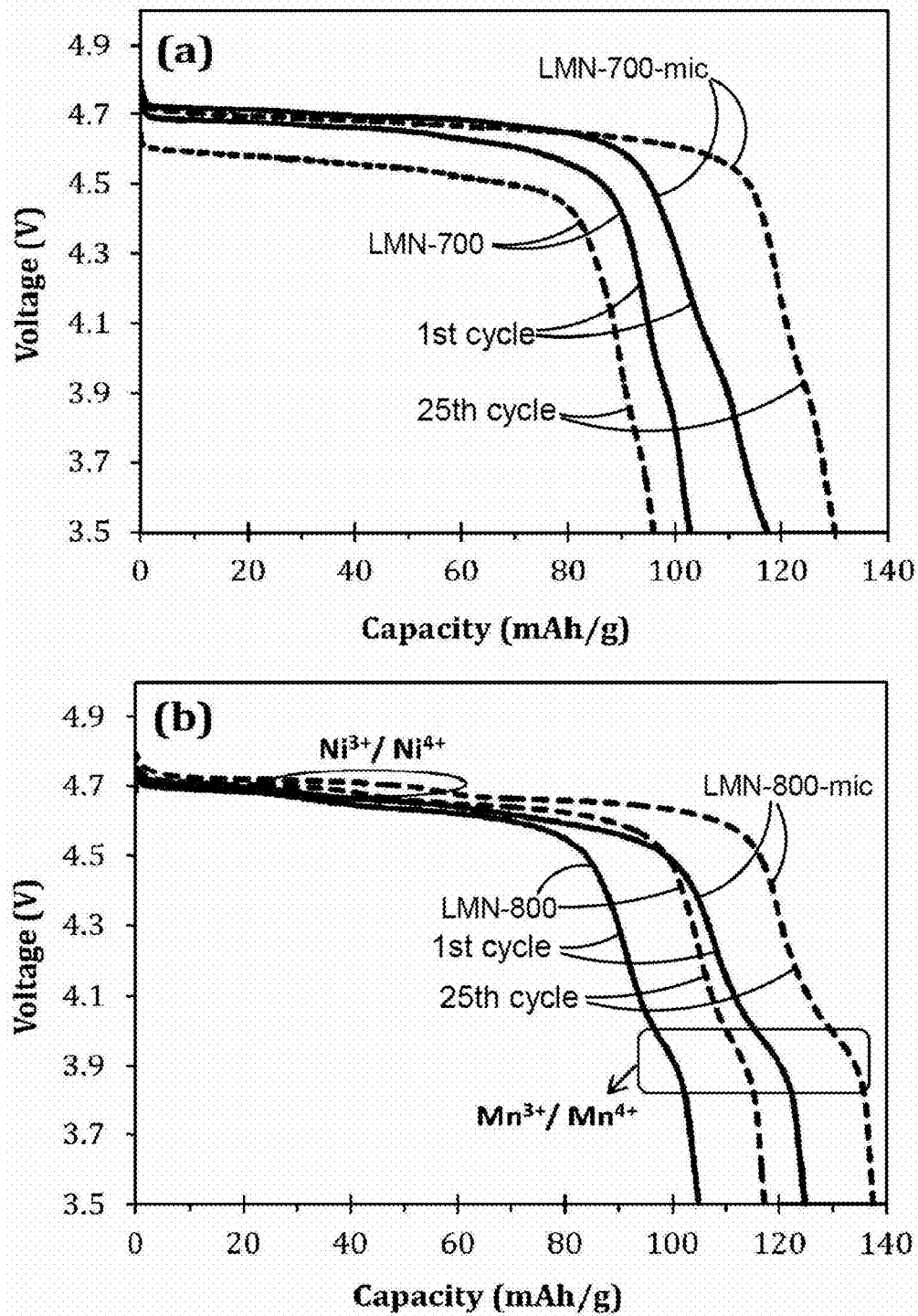

FIG. 4 compares the 1$^{st}$ and 25$^{th}$ discharge profiles of LMN-700/LMN-700-mic and LMN-800/LMN-800-mic discharged at 0.1 C (14 mA·g$^{-1}$). Unlike the materials obtained at 700° C., the samples from 800° C. showed well-defined plateaus at 4 V due to the Mn$^{3+}$/Mn$^{4+}$ redox couple, signature of 'disordered' spinel. In addition, the Ni$^{2+}$/Ni$^{3+}$ and Ni$^{3+}$/Ni$^{4+}$ redox couples of the disordered spinel are activated upon cycling, suggesting some structural changes induced by electrochemical cycling. The Mn$^{3+}$/Mn$^{4+}$ peaks are well-defined in the 800° C. compared to the 700° C.

samples. The capacity of the LMN-700 decreased from the 1$^{st}$ cycle (103 mAh/g) to the 25$^{th}$ cycle (96 mAh/g), which is typical of ordered spinel. However, upon microwave treatment, the initial capacity of the LMN-700-mic (117 mAh/g) increased to 130 mAh/g at the 25$^{th}$ cycle. For the 800° C. samples, the initial cycles of the bare and the microwave-treated samples (105 and 125 mAh/g, respectively) increased upon cycling (117 and 138 mAh/g at the 25$^{th}$ cycle, respectively). This increase in capacity upon cycling could be attributed to the wetting process of the electrodes with the electrolytes prior to stabilisation of the electrochemical reactions. The higher performance of the LMN-800-mic over the bare sample suggests the intrinsic ability of microwave irradiation to adjust the Mn$^{3+}$ concentration in the spinel for enhanced electrochemistry.

Capacity Retention (Cyclability) and Rate Capability

Figure 5:
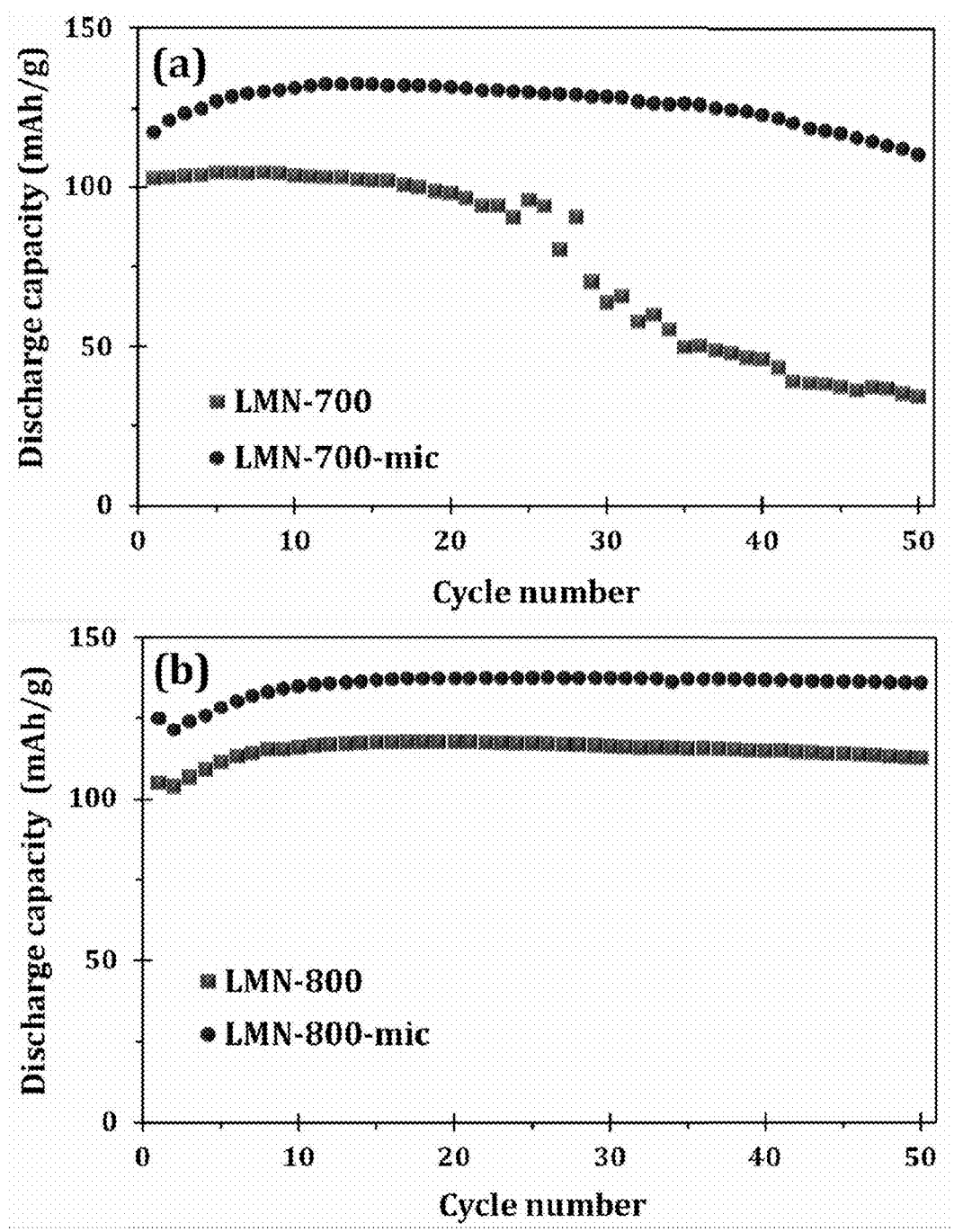

The cycle stability of the spinel samples at 50 repetitive cycles was explored. FIG. 5 compares the cycle stability of the bare and microwave-treated samples, which clearly proves that microwave irradiation improves the cyclability of the spinels (for both the ordered and disordered structures, with the latter benefiting the most). As shown in FIG. 5a, for the LMN-700, the discharge capacities differ (103, 96 and 34 mAh/g for the 1$^{st}$, 25$^{th}$ and 50th cycles, respectively). For the LMN-700-mic, it was 117, 130 and 110 mAh/g for the 1$^{st}$, 25$^{th}$ and 50th cycles, respectively. From the results, it is evident that microwave irradiation may serve as a viable strategy to improve the capacity retention for such LMN at 700° C. However, for the LMN-800 (FIG. 5b), the discharge capacities also differ (105, 117 and 113 mAh/g for the 1$^{st}$, 25$^{th}$ and 50th cycles, respectively. For the LMN-800-mic, it was 125, 138 and 136 mAh/g for the 1$^{st}$, 25$^{th}$ and 50th cycles, respectively.

As indicated by the FIG. 5, the best performance is always obtained by the LMN-800-mic sample, with a capacity retention of ca. 100% between the 10$^{th}$ and 50$^{th}$ cycle, compared to the capacity retentions of 97 and 84% for LMN-800 and LMN-700-mic, respectively. The excellent capacity retention of the LMN-800-mic may be partly due to the higher connectivity of the nanoparticles as seen in the FESEM pictures, and partly to the 'appropriate' amount of Mn$^{3+}$ induced by the microwave irradiation. In general, it is common knowledge that LMN sample obtained at higher temperature (800° C., disordered) shows better electrochemical performance than the 700° C. (ordered). Some of the reasons may be due to the better crystallinity and increased conductivity due to the Mn$^{3+}$ compared to the Mn$^{4+}$.

Figure 6:
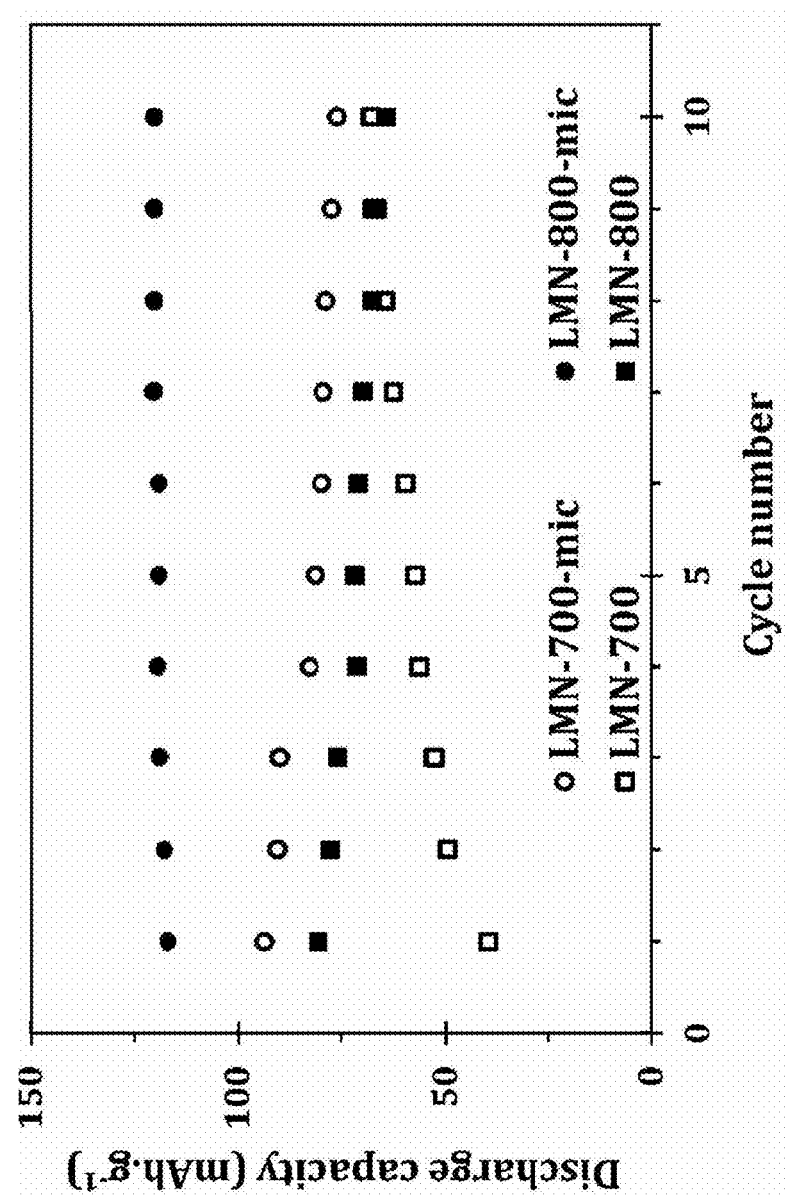
FIG. 6 show the cycling comparisons at 1 C rate of $LiMn_{1.5}Ni_{0.5}O_4$ spinel (annealed at 700° C. and 800° C.) and the $LiMn_{1.5}Ni_{0.5}O_4$ spinel radiated with microwaves (annealed at 700° C. and 800° C.) samples of the Example.
Figure 7:
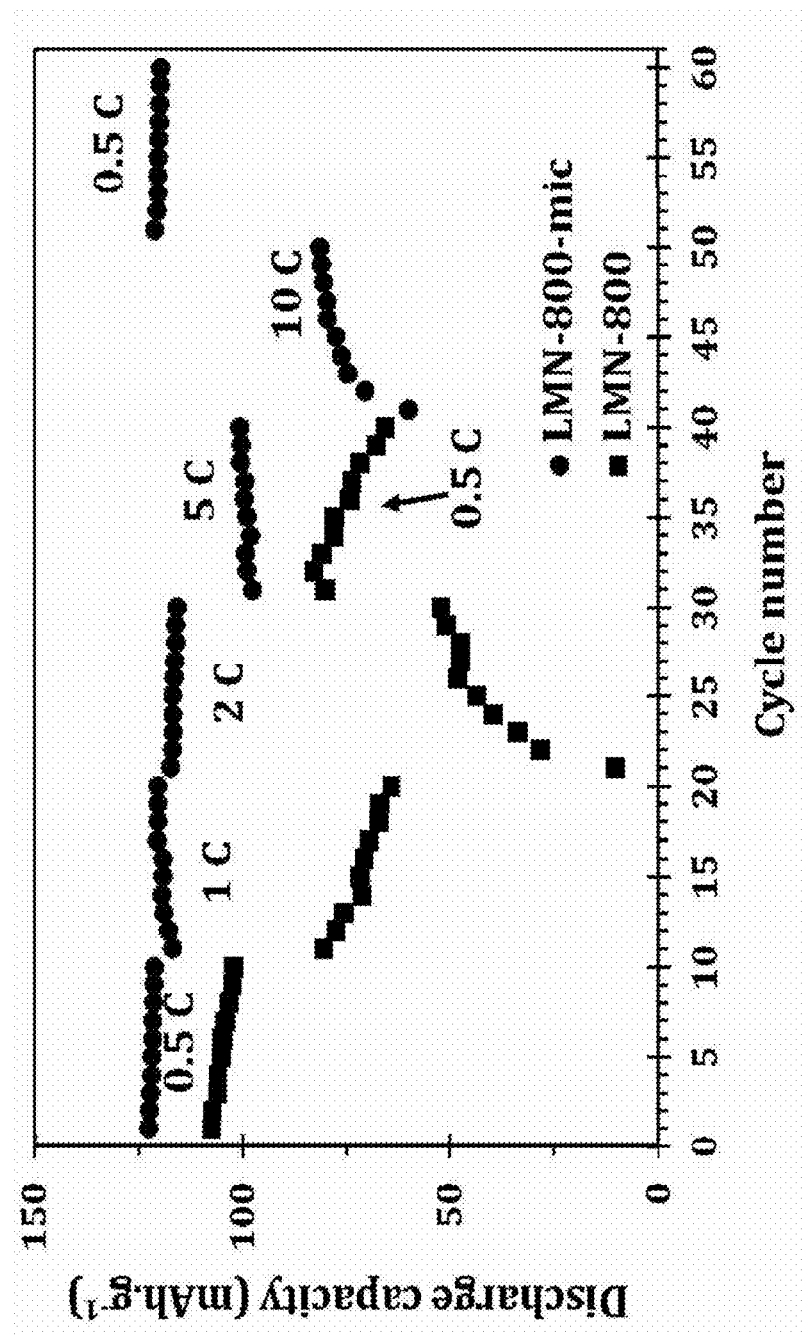
FIG. 7 show the cycling comparisons at different rates of the 800° C. annealed $LiMn_{1.5}Ni_{0.5}O_4$ spinel and the $LiMn_{1.5}Ni_{0.5}O_4$ spinel radiated with microwaves samples of the Example.

For high power applications, good rate capability is of utmost importance for any cathode materials for lithium ion battery. All the samples were charged at 14 mA/g (0.1 C) and discharged at 140 mA/g (1 C) and the 800° C. samples showed the best performance (FIG. 6). Thus, in this study, the 800° C. samples were charged at 14 mA/g (0.1 C) and discharged between 70 mA/g (0.5 C) and 1400 mA/g (10 C). FIG. 7 clearly proves that microwave treatment greatly enhances the rate capability of the spinel material.

The electrochemical performance of LiMn$_{1.5}$Ni$_{0.5}$O$_4$ as a lithium ion battery cathode material is intricately linked to the (i) presence of Mn$^{3+}$ ions, (ii) doping/substitution, (iii) degree of disorder, and (iv) impurities, which explains why it still remains a huge challenge to correlate synthesis, structure and performance of this cathode material. It is common knowledge that the Mn$^{3+}$ ion is electrochemically active, usually identified by the presence of a small plateau at around 4V; however, a portion of the Mn$^{3+}$ ions may also form Mn$^{2+}$ through the disproportion reaction; Mn$^{2+}$ dissolves into the electrolyte at elevated temperatures, causing significant capacity loss during cycling (J. Xiao, X. Chen, P. V. Sushko, M. L. Sushko, L. Kovarik, J. Feng, Z. Deng, J. Zheng, G. L. Graff, Z. Nie, D. Choi, J. Liu, J.- G. Zhang, M. S. Whittingham, *Adv. Mater.* 24 (2012) 2109-2116). To enhance the cyclability and eliminate the impurities in the LiMn$_{1.5}$Ni$_{0.5}$O$_4$, a commonly adopted approach hitherto has been to partially substitute Ni and/or Mn with metallic elements, such as Ti, Fe, Cr, Ru or Mg. A disordered or oxygen-deficient spinel (i.e. LiMn$_{1.5}$Ni$_{0.5}$O$_{4-\delta}$) is usually accompanied by an impurity (Li$_y$Ni$_{1-y}$O) that appears as a secondary phase in the products, which lowers the obtainable capacity. However, the cycling performance of the disordered spinel is better than the ordered spinel as the former gives a significantly higher Li$^+$ diffusion coefficient than the latter. In ordered P4$_3$32 phase, Mn$^{4+}$ and Ni$^{2+}$ ions are ordered on octahedral sites in a 3:1 ratio as opposed to random distribution in disordered Fd$_{3m}$ phase.

The Xiao et al reference referred to above, indicates 'careful control of the amount of Mn$^3$ ions and, thus, the disordered phase, is the key for synthesis of high performance spinel and provides valuable clues for understanding the structure-property relationships in energy materials'.

The electrochemical performance of any chemical material is strongly dependent on the synthesis strategy. It is evident from what is set out above that the preferred synthesis strategy for the high-voltage LiMn$_{1.5}$Ni$_{0.5}$O$_4$ spinel should be able to (i) control the amount of the Mn$^{3+}$ in the final lattice structure, and hence the site disorder, (ii) limit the amount of the Li$_y$Ni$_{1-y}$O impurity, and (iii) maintain its high voltage (4.8-5V) and achieve capacity close or better than the theoretical value of ~140 mAh/g$^{-1}$.

The inventors thus surprisingly found that by using a modified Pechini synthesis strategy coupled with microwave irradiation, a LiMn$_{1.5}$Ni$_{0.5}$O$_4$ spinel cathode material with desired properties could be obtained. For example, the inventors proved, for the first time, that it is possible to control the Mn$^{3+}$ content and site disorder by a simple microwave treatment. The inventors thus found that they could achieve the same or better results to those achievable by known processes, and using shorter processing times, by using low temperature annealing coupled with short duration 20 minutes) microwave irradiation.

Simply stated, the microwave-assisted strategy introduced by the inventors for the preparation and enhancing the electrochemical performance of LiMn$_{1.5}$Ni$_{0.5}$O$_4$ spinel materials promises to avoid many of the disadvantages associated with conventional procedures of making this spinel cathode material.

The invention claimed is:

1. A process for producing a lithium-manganese-nickel oxide spinel material, which process comprises maintaining a solution comprising a dissolved lithium compound, a dissolved manganese compound, a dissolved nickel compound, a hydroxycarboxylic acid, a polyhydroxy alcohol, and, optionally, an additional metallic compound, at an elevated temperature T$_1$, where T$_1$ is below the boiling point of the solution, until the solution gels;

maintaining the gel at an elevated temperature until it ignites and burns to form a Li—Mn—Ni—O powder;

calcining the Li—Mn—Ni—O powder to burn off carbon and/or other impurities present in the powder, thereby obtaining a calcined powder;

subjecting the calcined powder to microwave treatment, to obtain a treated powder; and annealing the treated powder to crystallize the powder, thereby obtaining an annealed lithium-manganese-nickel-oxide spinel material.

2. The process according to claim 1, wherein the solution includes water as a solvent for the lithium compound, the manganese compound, and the nickel compound, which are thus water soluble salts thereof, with 90° C.≤$T_1$<100° C.

3. The process according to claim 2, wherein $T_1$ is about 90° C.

4. The process according to claim 1, wherein the elevated temperature at which the gel is maintained is $T_2$, where 90° C.≤$T_2$<100° C.

5. The process according to claim 4, wherein $T_2$ is about 90° C.

6. The process according to claim 1, wherein the calcination of the Li—Mn—Ni—O powder is effected at a temperature $T_3$, where 400° C.≤$T_3$<600°C.

7. The process according to claim 6, wherein $T_3$ is about 500° C.

8. The process according to claim 1, wherein the annealing of the treated powder is effected at a temperature $T_4$, where 700° C.≤$T_4$≤900° C.

9. The process according to claim 8, wherein 700° C.≤$T_4$≤800° C.

10. The process according to claim 1, wherein the lithium-manganese-nickel oxide spinel material is undoped, and is $LiMn_{1.5}Ni_{0.5}O_4$.

11. The process according to claim 1, wherein the lithium-manganese-nickel oxide spinel material is doped.

12. The process according to claim 11, wherein the lithium-manganese-nickel oxide spinel material is ordered so that it is not oxygen deficient.

13. The process according to claim 1, which includes using the additional metallic compound to improve stability of the spinel material, with the additional metallic compound being a compound of aluminium or zirconium.

14. The process according to claim 1, wherein the hydroxycarboxylic acid is citric acid.

15. The process according to claim 14, wherein the polyhydroxy alcohol is ethylene glycol.

16. The process according to claim 15, wherein the citric acid and the ethylene glycol are present in the solution in a molar ratio of citric acid to ethylene glycol of about 1:4.

17. The process according to claim 1, wherein the microwave treatment comprises subjecting the calcined powder to microwaves at about 60° C. for between 10 and 20 minutes.

18. The process according to claim 1, further comprising subjecting the annealed lithium-manganese-nickel-oxide spinel material to a second microwave treatment.

19. The process according to claim 18, wherein the second microwave treatment comprises subjecting the annealed lithium-manganese-nickel-oxide spinel material to microwaves at about 60° C. for between 10 and 20 minutes.

20. A process for producing a lithium-manganese-nickel oxide spinel material, which process comprises
   maintaining a solution comprising a dissolved lithium compound, a dissolved manganese compound, a dissolved nickel compound, a hydroxycarboxylic acid, a polyhydroxy alcohol, and, optionally, an additional metallic compound, at an elevated temperature $T_1$, where $T_1$ is below the boiling point of the solution, until the solution gels;
   maintaining the gel at an elevated temperature until it ignites and burns to form a Li—Mn—Ni—O powder;
   calcining the Li—Mn—Ni—O powder to burn off carbon and/or other impurities present in the powder, thereby obtaining a calcined powder;
   subjecting the calcined powder to microwave treatment at a maximum temperature of 60° C., to obtain a treated powder; and
   annealing the treated powder to crystallize the powder, thereby obtaining an annealed lithium-manganese-nickel-oxide spinel material.

* * * * *